(12) United States Patent
Sivakumar

(10) Patent No.: US 7,358,111 B2
(45) Date of Patent: Apr. 15, 2008

(54) IMAGEABLE BOTTOM ANTI-REFLECTIVE COATING FOR HIGH RESOLUTION LITHOGRAPHY

(75) Inventor: Swaminathan Sivakumar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 14 days.

(21) Appl. No.: 11/262,247

(22) Filed: Oct. 28, 2005

(65) Prior Publication Data

US 2006/0051956 A1 Mar. 9, 2006

Related U.S. Application Data

(62) Division of application No. 10/150,197, filed on May 17, 2002, now Pat. No. 7,265,431.

(51) Int. Cl.
*H01L 21/00* (2006.01)
(52) U.S. Cl. .............. 438/72; 438/69; 438/71

(58) Field of Classification Search .......... 438/69, 438/71, 72, 636
See application file for complete search history.

(56) References Cited

U.S. PATENT DOCUMENTS 5,804,338 A * 9/1998 Lim et al. ............ 430/5
6,225,215 B1 * 5/2001 Taravade et al. ......... 438/636

FOREIGN PATENT DOCUMENTS

JP 11143080 A * 5/1999

* cited by examiner

*Primary Examiner*—Kevin M Picardat
(74) *Attorney, Agent, or Firm*—Trop, Pruner & Hu, P.C.

(57) ABSTRACT

A semiconductor wafer may be coated with an imageable anti-reflective coating. As a result, the coating may be removed using the same techniques used to remove overlying photoresists. This may overcome the difficulty of etching anti-reflective coatings using standard etches because of their poor selectivity to photoresist and the resulting propensity to cause integrated circuit defects arising from anti-reflective coating remnants.

5 Claims, 1 Drawing Sheet

IMAGEABLE BOTTOM ANTI-REFLECTIVE COATING FOR HIGH RESOLUTION LITHOGRAPHY

CROSS-REFERENCE TO RELATED APPLICATIONS

This application is a divisional of U.S. patent application Ser. No. 10/150,197, filed on May 17, 2002 now U.S. Pat. No. 7,265,431.

BACKGROUND

This invention relates generally to semiconductor integrated circuits and, particularly, to lithographic techniques for patterning and defining structures on integrated circuits.

Integrated circuits may be manufactured by processes that use lithography. Generally, lithography involves exposing a surface to create a mask on a semiconductor structure. That mask may then be utilized to form desired structures in or over the semiconductor structure.

Commonly, the mask may be defined in a photoresist that is exposed to light. Photoresist may be either positive or negative photoresist. Positive photoresist becomes more soluble when exposed and negative photoresist becomes less soluble when exposed. Thus, by exposing a photoresist through a selective light pattern, some regions of the photoresist may be exposed while others are not. As a result, the solubility of the exposed regions is different from the solubility of the unexposed regions. This difference in solubility may be utilized to create a mask on the semiconductor structure to define features therein, for example, by etching.

One issue with photolithography is that there may be reflection from the underlying semiconductor structure during exposure that alters the effectiveness of the photoresist. To overcome this problem, a bottom anti-reflective coating (organic bottom ARC) substrate may be utilized. In such case, the substrate is coated with an anti-reflective coating.

Organic bottom ARCs may be very difficult to completely etch using standard etch techniques, with relatively poor selectivity to photoresist and a propensity to cause defects. For example, in some cases, a portion of the bottom ARC may remain after processing. This may cause a defect in the resulting product.

Because of the relatively low selectivity to photoresist, the etching used to remove the ARC may result in higher resist erosion rates during the ARC etch. The higher erosion rates may result in poor etch profiles and micromasking defects caused by incomplete removal of the ARC during the subsequent substrate etch.

Thus, there is a need for anti-reflective coated substrates that have more readily removable anti-reflective coatings.

DETAILED DESCRIPTION

Figure 1:
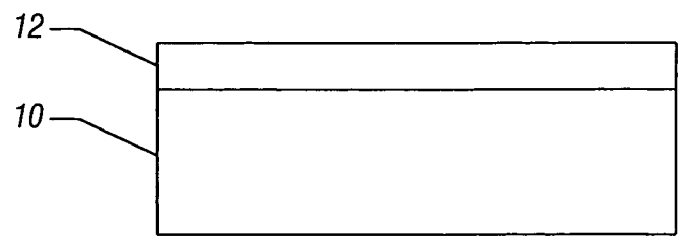
FIG. 1 is an enlarged cross-sectional depiction of one embodiment of the present invention.

In accordance with some embodiments of the present invention, a bottom anti-reflective coated semiconductor structure 10, shown in FIG. 1 may include a anti-reflective coating 12 that is imageable. In other words, the coating 12 may be photodefinable. Since the coating 12 is photodefinable, there is no need to conventionally etch the coating 12 in order to remove it.

The coating 12 may be made photodefinable in the same way that photoresist layers are made photodefinable. For example, positive photoresists commonly use diazo oxides or compounds that have an $N_2$ group bonded to an organic molecule. Exposing the photoresist to light leads to disassociation. Similarly, negative photoresists may use polyisoprene which loses solubility when exposed. Another technique for making a photodefinable or imageable compound is to use compounds that generate a photo acid upon exposure that catalyzes a deblocking reaction causing the resin in the exposed areas to dissolve in the developer.

A variety of chemistries may be utilized to form photoresist. The same chemistries may be commonly utilized to form a photosensitive anti-reflective coating 12 on a semiconductor structure 10, such as a silicon substrate. The coating 12 may be spun-on at odd multiples of the thickness needed to cause destructive interference at one-quarter wavelengths of light, in some embodiments.

In some embodiments, a second photoresist film may be utilized as the anti-reflective coating 12. The second photoresist film may be chosen for its anti-reflection properties and its ability to meet any planarizing properties useful in some anti-reflective coatings.

In some embodiments, the coating 12 may be pre-formed on a wafer forming the structure 10. In other embodiments, the coating 12 may be applied independently to the wafer including the structure 10.

Figure 2:
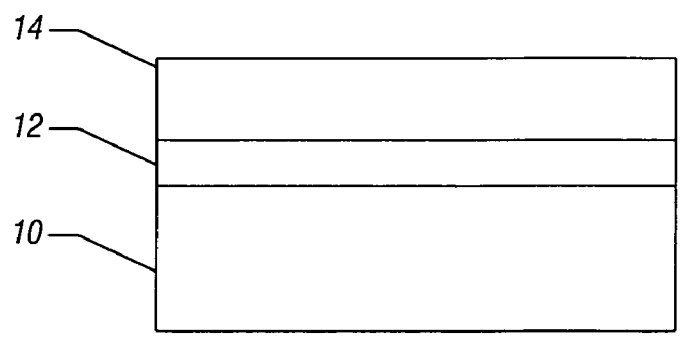
FIG. 2 is an enlarged cross-sectional view of the embodiment shown in FIG. 1 after subsequent processing.
Figure 3:
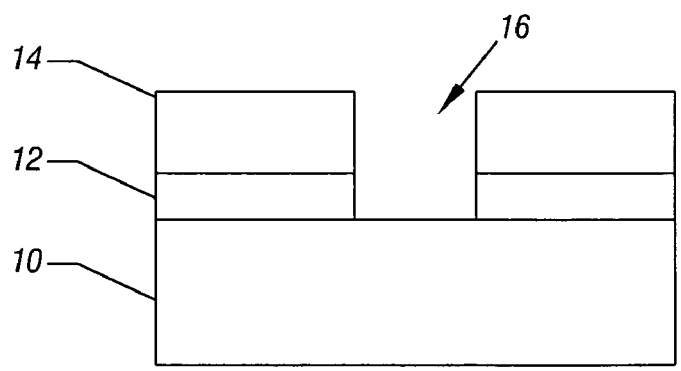
FIG. 3 is an enlarged cross-sectional view of the embodiment shown in FIG. 2 after subsequent processing.

Referring to FIG. 2, a photoresist 14 may be spun-on over the coating 12. Then, the photoresist 14 and the coating 12 may be exposed to radiation, such as light, and developed. The exposed material may be removed, in a positive photoresist example, to form an open area 16 through both the photoresist 14 and the coating 12.

In some embodiments, the exposure and removal of both the photoresist 14 and coating 12 may be done in one step. In other embodiments, it may be desirable to expose the photoresist 14 and remove the photoresist 14 where exposed (in a positive photoresist example). Subsequently the anti-reflective coating 12 may be exposed and removed using the same techniques utilized independently for photoresist removal.

Figure 4:
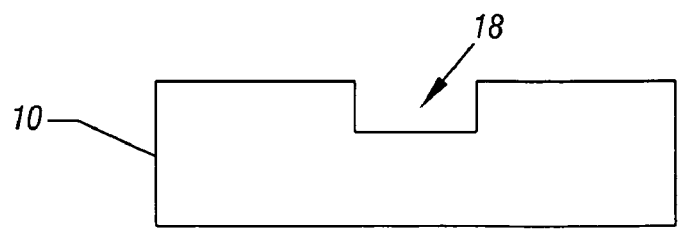
FIG. 4 is an enlarged cross-sectional view of the embodiment shown in FIG. 3 after subsequent processing.

Finally, referring to FIG. 4, once the photoresist 14 and coating 12 have been patterned, they may be utilized as an etch mask, in one embodiment, to form the aperture 18, shown in FIG. 4. Thereafter, both the photoresist 14 and the coating 12 may be removed.

In some embodiments, the thickness of the coating 12 may be selected to induce destructive interference between the illumination incident on the coating 12 and the light reflected from the semiconductor structure 10. This thickness may be formed in one spin-on coating or may be the result of a series of successive spin-on coatings in some embodiments.

Another technique to reduce reflections from the substrate is to adjust the absorption of the ARC material itself to reduce the reflectivity of the substrate and to reduce standing wave generation within the ARC. This approach is possible where the ARC is photosensitive.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
adding a material to an anti-reflective coating to make the anti-reflective coating photodefinable;
forming a semiconductor structure with a photodefinable anti-reflective coating is removed where exposed;
covering said coating with a photoresist; and
in one step, exposing said photoresist and said coating to remove only a portion of said photoresist and only a portion of said coating.

2. The method of claim 1 including separately exposing said photoresist and said coating.

3. The method of claim 2 including separately removing said coating and said photoresist.

4. The method of claim 1 including coating said semiconductor structure with said anti-reflective coating.

5. The method of claim 1 including partially removing the anti-reflective coating and the photoresist without etching.

* * * * *

UNITED STATES PATENT AND TRADEMARK OFFICE
CERTIFICATE OF CORRECTION

PATENT NO. : 7,358,111 B2 Page 1 of 1
APPLICATION NO. : 11/262247
DATED : April 15, 2008
INVENTOR(S) : Swaminathan Sivakumar It is certified that error appears in the above-identified patent and that said Letters Patent is hereby corrected as shown below:

Column 3
Line 6, after "coating", insert --that--.

Signed and Sealed this

Eighth Day of July, 2008

JON W. DUDAS
*Director of the United States Patent and Trademark Office*